United States Patent
Carroll et al.

(10) Patent No.: US 6,356,496 B1
(45) Date of Patent: Mar. 12, 2002

(54) RESISTOR FUSE

(75) Inventors: Michael Scott Carroll; Frank Yauchee Hui; Tony G. Ivanov, all of Orlando, FL (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/612,052

(22) Filed: Jul. 7, 2000

(51) Int. Cl.[7] .................................................. G11C 7/00
(52) U.S. Cl. ............................. 365/225.7; 365/185.03; 257/209
(58) Field of Search .......................... 365/225.7, 185.03; 257/209, 529

(56) References Cited

U.S. PATENT DOCUMENTS

| | | | |
|---|---|---|---|
| 5,068,696 A | * 11/1991 | Yang et al. | 257/344 |
| 5,099,148 A | * 3/1992 | McClure et al. | 307/443 |
| 5,872,734 A | 2/1999 | Chan et al. | 365/162 |
| 5,882,998 A | * 3/1999 | Sur, Jr. et al. | 257/209 |
| 5,912,839 A | 6/1999 | Ovshinsky et al. | 365/185.03 |
| 5,976,943 A | * 11/1999 | Manley et al. | 438/382 |
| 6,222,244 B1 | * 4/2001 | Arndt et al. | 257/529 |

OTHER PUBLICATIONS

"A PROM Element Based on Salicide Agglomeration of Poly Fuses in a CMOS Logic Process" by Mohsen Alavi, Mark Bohr, Jeff Hicks, Martin Denham, Allen Cassens, Dave Douglas and Min–Chun Tsai: 1997 IEEE; pp. 855–858.

IBM Technical Disclosure Bulletin: vol. 26, No. 8: Jan. 1984: entitled "Element Trimming Fusible Link" by D. J. Nickel.

"Programming Mechanism of Polysilicon Resistor Fuses" by David W. Greve: Apr. 1982: pp. 20–25.

* cited by examiner

Primary Examiner—Huan Hoang

(57) ABSTRACT

A resistor fuse for use in a semiconductor device having an operating voltage. In one embodiment, the resistor fuse includes a silicon layer located over a semiconductor wafer and a metal silicide layer located over the silicon layer. The resistor fuse has a predetermined current threshold and is configured to open if a current through the resistor fuse at the operating voltage exceeds the current threshold.

39 Claims, 5 Drawing Sheets

RESISTOR FUSE

TECHNICAL FIELD OF THE INVENTION

The present invention is directed, in general, to electronic devices and, more specifically, to a resistor fuse and methods of manufacturing and operating the resistor fuse.

BACKGROUND OF THE INVENTION

While technological advances are permitting an increasing number of circuit elements (e.g., transistors, resistors) to be incorporated into an integrated circuit, reducing or eliminating defects in the circuit elements is becoming increasingly more difficult as the size of the circuit elements are reduced. The reduced size brings about an increased susceptibility to defects caused by material impurities and tolerances in the fabrication process of such integrated circuits.

Improved testing procedures generally allow the defects to be identified upon completion of the integrated circuit. Circuits containing a large number of defective circuit elements are usually discarded. Those containing only a small number of defective circuit elements, however, may be preserved, for example, by substituting non-defective redundant circuit elements for the defective ones, thereby significantly reducing the number of rejected integrated circuits. Additionally, many integrated circuits are generally constructed with a number of redundant circuit elements and semiconductor fuses arranged such that a redundant circuit element may be readily substituted for a defective one by merely opening the appropriate fuses.

Currently, semiconductor devices with fuses employ metal fuses. The metal fuses, however, may be difficult to program, since it may require as much as 200 mA to open the metal fuse. Further, it may be difficult to ascertain whether a particular metal fuse has actually opened, since the metal fuse may merely experience a change in resistance. Detection schemes for use with the metal fuses are necessarily more complex than a simple open circuit/short circuit detection scheme. Additionally, since the metal fuses are constructed at the metal level (e.g., a metal three level), an alternative is needed when using processes such as copper damascene technology since the copper in the fuse will diffuse throughout the semiconductor integrated circuit if the fuse is opened (i.e., blown).

Accordingly, what is needed in the art is a resistor fuse that overcomes the deficiencies of the prior art metal fuses.

SUMMARY OF THE INVENTION

To address the above-discussed deficiencies of the prior art, the present invention provides, in one aspect, a resistor fuse for use in a semiconductor device having an operating voltage. In one embodiment, the resistor fuse includes a silicon layer located over a semiconductor wafer and a metal silicide layer located over the silicon layer. The resistor fuse has a predetermined current threshold and is configured to open if a current through the resistor fuse at the operating voltage exceeds the current threshold.

The present invention therefore provides, in this aspect, a resistor fuse formed from a silicon layer and a metal silicide layer. The resistor fuse of the present invention thus avoids the use of a metal layer as was commonly employed in prior art fuses. The resistor fuse of the present invention may, therefore, be used even when employing processes including, for instance, copper damascene technology.

Another aspect of the present invention provides a method of forming the resistor fuse. The method includes forming a silicon layer over a semiconductor wafer. A metal layer is then deposited over the silicon layer. The metal layer is thermally treated to form a metal silicide layer over the silicon layer.

Yet another aspect of the present invention provides a method of operating a resistor fuse in a semiconductor device having an operating voltage. The method includes applying a voltage within the operating voltage across the resistor fuse. A current is developed through the resistor fuse, which may cause the resistor fuse to open depending on the voltage applied across the resistor fuse.

Another aspect of the present invention provides a method of trimming an adjustable resistor. The adjustable resistor includes a first resistor fuse having a first resistance. The adjustable resistor further includes a second resistor fuse, having a second resistance different from the first resistance, coupled in parallel to the first resistor fuse. The method includes applying a voltage across the adjustable resistor. First and second currents are then developed through the first and second resistor fuses, respectively. At least one of the first and second resistor fuses may open as a function of the voltage applied across the adjustable resistor. A total resistance of the adjustable resistor may thus be trimmed using the foregoing method.

Still another aspect of the present invention provides a method of programming a non-volatile multi-state memory cell. The memory cell includes a first resistor fuse having a first resistance. The memory cell further includes a second resistor fuse, having a second resistance different from the first resistance, coupled in parallel with the first resistor fuse. The memory cell still further includes a third resistor fuse, having a third resistance different from the first and second resistances, coupled in parallel with the first and second resistor fuses. The method includes applying a voltage across the memory cell. First, second and third currents are developed through the first, second and third resistor fuses, respectively. The currents cause any number of the first, second and third resistor fuses to selectively open as a function of the voltage. The memory cell may thus attain a state as a function of the first, second and third resistances.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
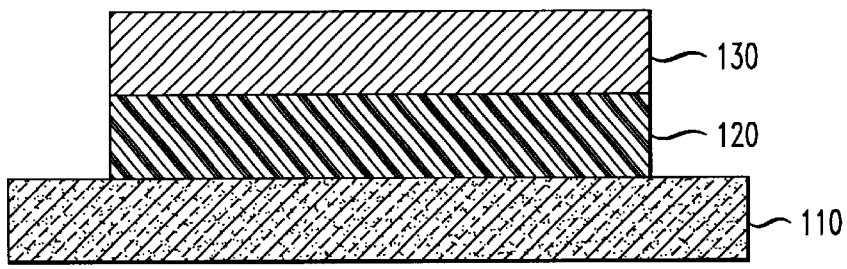
FIG. 1 illustrates a cross-sectional view of an embodiment of a resistor fuse constructed in accordance with the principles of the present invention.

Referring initially to FIG. 1, illustrated is a cross-sectional view of an embodiment of a resistor fuse 100 constructed in accordance with the principles of the present invention. The resistor fuse 100 includes a silicon layer 120 located over a semiconductor wafer 110 and a metal silicide layer 130 located over the silicon layer 120. In the illustrated embodiment, the silicon layer 120 is a poly-silicon layer, while the metal silicide layer 130 is a tungsten silicide layer. Of course, other materials may be employed and still remain well within the scope of the present invention. A resistance of the resistor fuse 100 is a function of physical dimensions (e.g., length, width) of the resistor fuse 100. The resistance of the resistor fuse 100 is further a function of the materials employed in forming the resistor fuse 100. The resistor fuse 100 is designed for use in a semiconductor device (not shown) and is therefore configured to open if a current through the resistor fuse 100 at an operating voltage of the semiconductor device exceeds a predetermined current threshold of the resistor fuse 100.

The resistor fuse 100 is formed as follows. The silicon layer 120 (e.g., poly-silicon) is formed over the semiconductor wafer 110 using conventional processes, such as physical or chemical vapor deposition. The silicon layer may be doped to standard levels, such as that used in the core process. A metal layer (e.g., tungsten) is then deposited over the silicon layer 120 by conventional processes, such as sputtering. The metal layer may be then be thermally treated, using a conventional process, such as an anneal, to form a metal silicide layer 130 (e.g., a tungsten-silicide layer).

The resistor fuse 100 is advantageously formed with a predetermined current threshold lower than that of prior art metal fuses, such that a current through the resistor fuse 100 at an operating voltage of the semiconductor device will exceed the predetermined current threshold, causing the resistor fuse 100 to open. The resistor fuse 100 may thus be operated without requiring a voltage beyond the operating voltage of the semiconductor device.

Figure 2A:
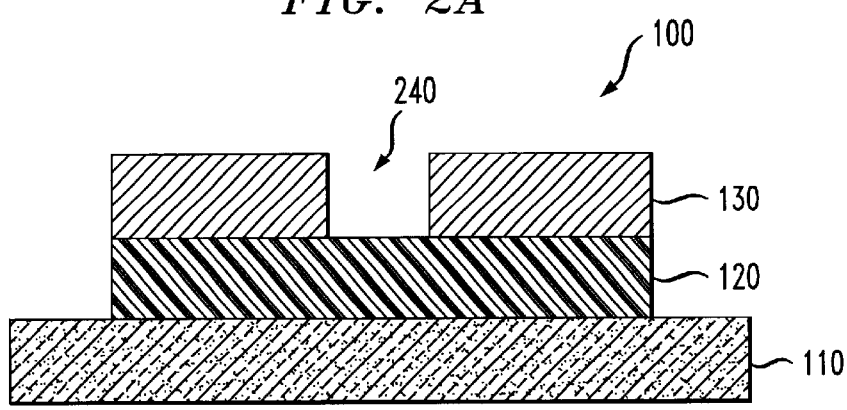
FIGS. 2A and 2B illustrate cross-sectional views of the resistor fuse of FIG. 1 during an operation thereof.
Figure 2B:
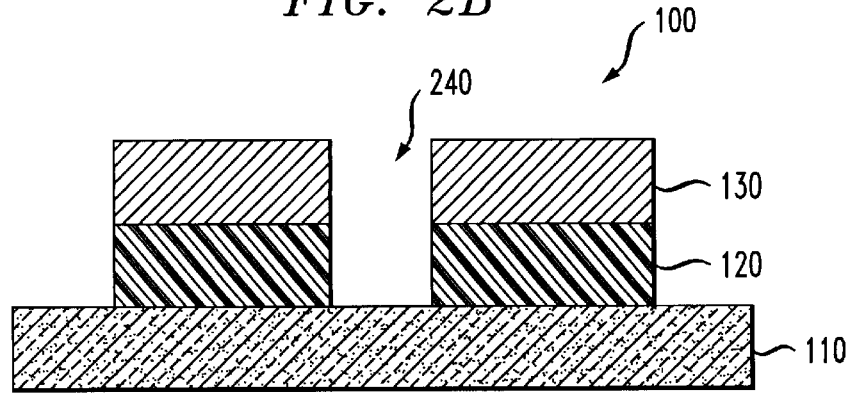

Turning now to FIGS. 2A and 2B, illustrated are cross-sectional views of the resistor fuse 100 of FIG. 1 during an operation thereof. More specifically, FIG. 2A illustrates the resistor fuse 100 during a first operational phase wherein a void initially develops in the metal silicide layer 130. FIG. 2B illustrates the resistor fuse 100 during a second operational phases wherein the void continues into the silicon layer 120, causing the resistor fuse 100 to open.

The method of operating the resistor fuse 100 will be described with respect to FIGS. 2A and 2B. First, a voltage within an operating voltage of the semiconductor device is applied across the resistor fuse 100. For example, in a resistor fuse 100 designed for use with 3.3 V devices, the resistor fuse 100 may be designed to have a resistance such that a voltage less than 3.3 V (e.g., 2.0 V) will develop a current through the resistor fuse 100 that is sufficient to cause the resistor fuse 100 to open.

The silicon layer 120 generally has a resistance that is different from a resistance of the metal-silicide layer 130. In the illustrated embodiment, wherein the silicon layer 120 is a poly-silicon layer and the metal-silicide layer 130 is a tungsten-silicide layer, the resistance of the poly-silicon layer is higher than the resistance of the tungsten-silicide layer. A greater portion of the current through the resistor fuse 100 will therefore flow through the metal-silicide layer 130. If the amount of current through the metal-silicide layer 130 exceeds a predetermined amount, a void 240 will develop therein. The void 240 may form as a result of an electro-migration process or another similar process.

The development of the void 240 now creates a high resistance area in the resistor fuse 100. Substantially all the current through the resistor fuse 100 now flows through the higher resistance silicon layer 120. A transient current surge caused by the redirection of current that was flowing through the metal-silicide layer 130 to the silicon layer 120 causes the void 240 to extend to the silicon layer 120. The resistor fuse 100 may therefore be considered to have opened (i.e., blown).

Resistors are generally employed in integrated circuits. The resistance of a particular resistor, however, is particularly influenced by material impurities and tolerances in the fabrication process. One way of adjusting the resistance of a resistor after fabrication includes providing a meandering path of resistive material, with portions of the meandering path short-circuited by metal fuses. The metal fuses may then be opened to force current to conduct through the meandering path, thereby increasing a resistance of the resistor. Each of the metal fuses of the prior art, however, require two control pins to allow the fuse to be opened. In a resistor having a high degree of adjustability, the number of control pins may be prohibitively high. As will become more apparent, an adjustable resistor constructed in accordance with the principles of the present invention will require fewer control pins.

Figure 3A:
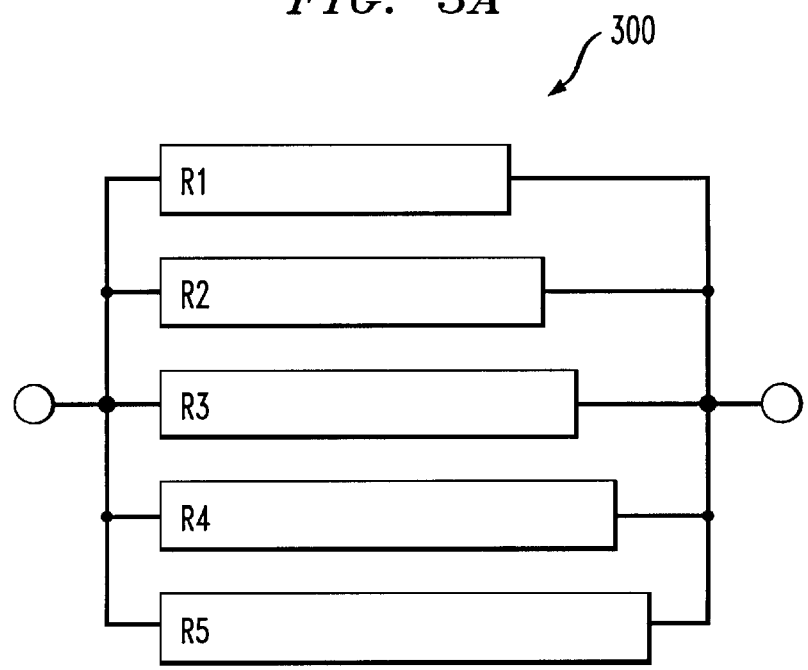
FIGS. 3A and 3B illustrate block diagrams of an embodiment of an adjustable resistor constructed in accordance with the principles of the present invention.
Figure 3B:
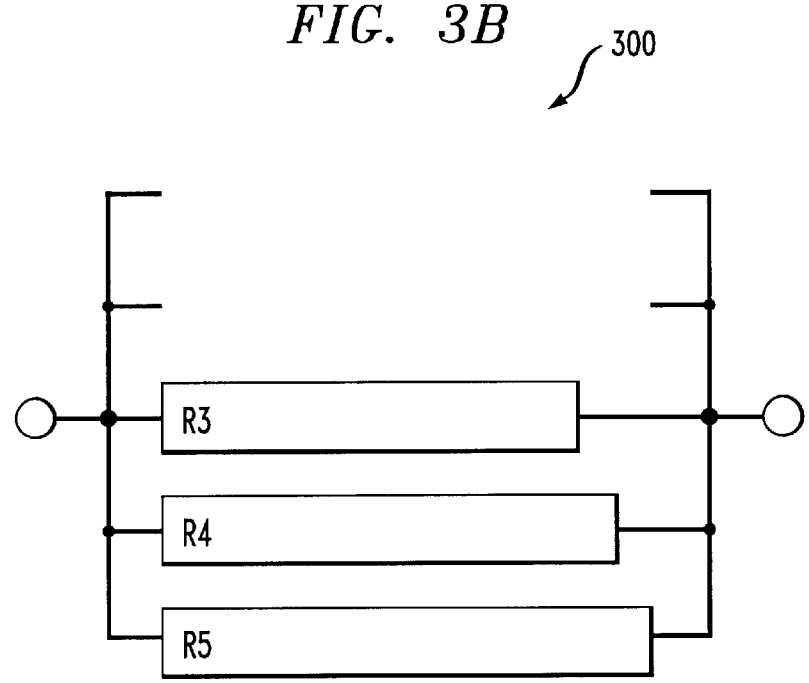

Turning now to FIGS. 3A and 3B, illustrated are block diagrams of an embodiment of an adjustable resistor 300 constructed in accordance with the principles of the present invention. More specifically, FIG. 3A illustrates the adjustable resistor 300 before trimming, while FIG. 3B illustrates the adjustable resistor 300 after trimming. The adjustable resistor 300 includes first, second, third, fourth and fifth resistor fuses R1, R2, R3, R4, R5 coupled in parallel. Each of the first, second, third, fourth and fifth resistor fuses R1, R2, R3, R4, R5 have different resistances. The resistor fuses R1, R2, R3, R4, R5 may be formed to have substantially equal widths, but different lengths. The relative resistances of the resistor fuses R1, R2, R3, R4, R5 may therefore be proportional to the lengths thereof. A total resistance of the adjustable resistor is a function of the resistances of the first, second, third, fourth and fifth resistor fuses R1, R2, R3, R4, R5.

The adjustable resistor 300 may be trimmed as follows. A voltage is applied to the control pins (across the adjustable resistor) and currents are developed through each resistor fuse R1, R2, R3, R4, R5 of the adjustable resistor 300. The resistor fuses R1, R2, R3, R4, R5 form, in effect, a current divider, with the shortest resistor fuse having the least resistance and drawing the most current. As the voltage is increased, at some point, the current through the shortest resistor fuse will exceed a current threshold of the resistor fuse, causing the shortest resistor fuse to open, thereby changing the total resistance of the adjustable resistor 300. As the voltage across the adjustable resistor 300 increases, the next shortest resistor fuse will open when a current therethrough exceeds a current threshold of the resistor fuse.

While the above example depicts increasing the voltage across the adjustable resistor 300 to cause the shortest of the resistor fuses R1, R2, R3, R4, R5 to open one at a time, a voltage sufficient to cause more than one of the resistor fuses R1, R2, R3, R4, R5 to open at the same time may be applied. Trimming of the adjustable resistor 300 may thus be accomplished in one step.

Since the total resistance of the adjustable resistor 300 is a function of the resistances of the resistor fuses R1, R2, R3, R4, R5, the opening of one or more of the resistor fuses R1, R2, R3, R4, R5 will cause the total resistance of the adjustable resistor 300 to change.

FIG. 3B, therefore, illustrates the effective resistance of the adjustable resistor 300 after trimming. While the illustrated adjustable resistor 300 shows the removal of two resistor fuses (due to the fuses opening), any number of resistor fuses may be opened as may be required to obtain a desired total resistance.

Figure 4:
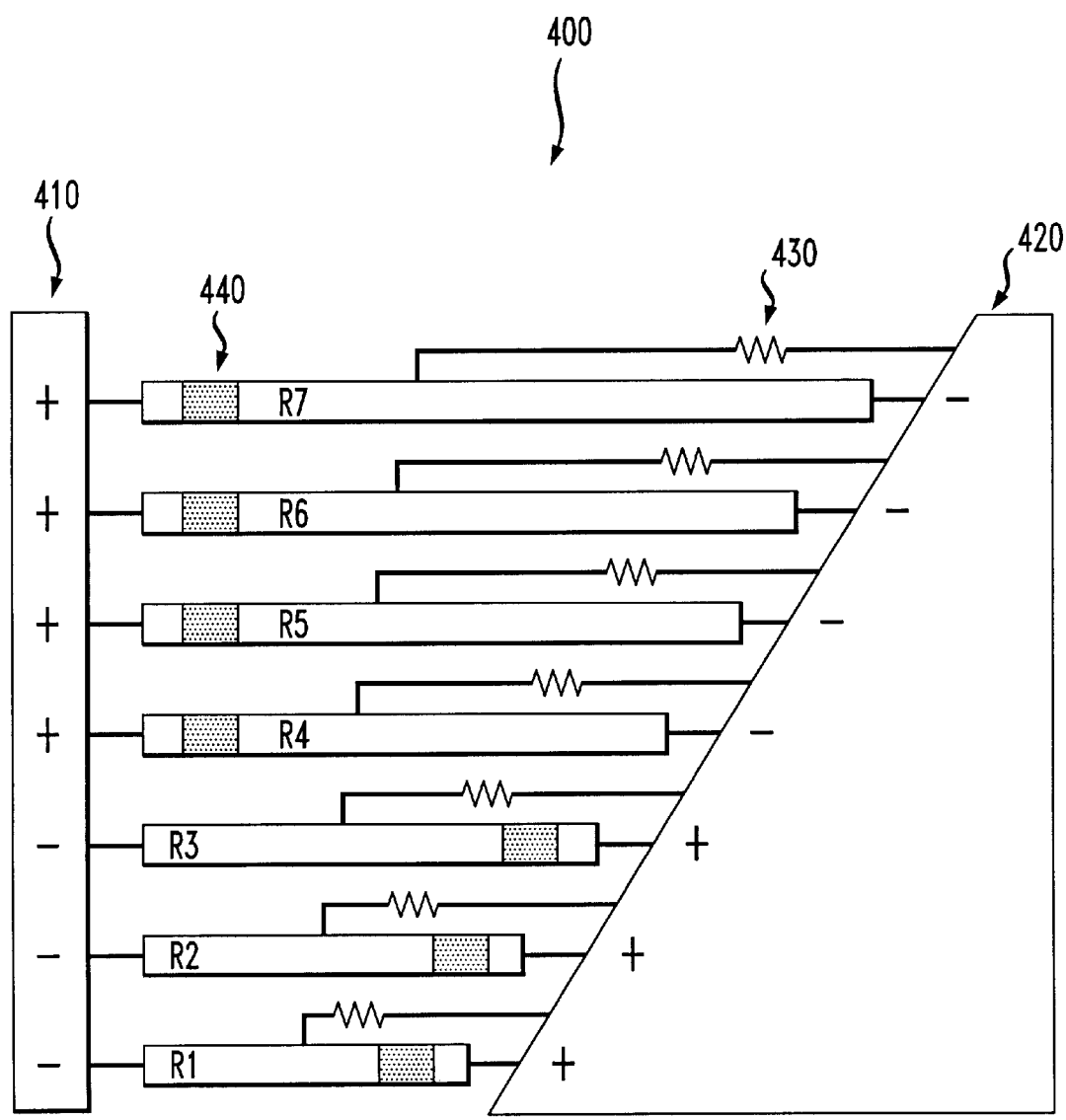
FIG. 4 illustrates a block diagram of another embodiment of an adjustable resistor constructed in accordance with the principles of the present invention.

Turning now to FIG. 4, illustrated is a block diagram of another embodiment of an adjustable resistor 400 constructed in accordance with the principles of the present invention. The adjustable resistor 400 is designed to have a total resistance in the mega-ohm range. Ordinarily, trimming such a resistor would require a very high voltage, typically far beyond an operating voltage of a device employing the resistor. The adjustable resistor 400, however, advantageously allows the trimming voltage to remain within the operating voltage of the device.

The adjustable resistor 400 includes first, second, third, fourth, fifth, sixth and seventh resistor fuses R1, R2, R3, R4, R5, R6, R7 coupled in parallel and across first and second contacts 410, 420. In an advantageous embodiment, the resistor fuses R1, R2, R3, R4, R5, R6, R7 may be formed to have substantially equal widths, but different lengths and, therefore, different resistances. The adjustable resistor 400 further includes a number of high value resistors (one of which is designated 430), each coupled between the second contact 420 and one of the resistor fuses R1, R2, R3, R4, R5, R6, R7.

A resistor fuse (such as one of the resistor fuses R1, R2, R3, R4, R5, R6, R7) may be opeded by applying a voltage across the resistor fuse that develops a current exceeding a predetermined current threshold of the resistor fuse. The current through the resistor fuse causes a void (one of which is designated 440) to develop therein. The void 440 tends to develop proximate a positive polarity of the voltage applied across the resistor fuse. The adjustable resistor 400 of the present invention advantageously exploits the location of the voids 440 (for instance, proximate the positive polarity) to enable the adjustable resistor 400 to have a total resistance in the mega-ohm range, while retaining the ability to be trimmed with a voltage within the operating voltage of the device.

The adjustable resistor 400 may be trimmed as follows. In the illustrated embodiment, a first voltage V1 is applied across the adjustable resistor 400 such that a negative polarity of the first voltage V1 is applied to the first contact 410 while a positive polarity of the first voltage V1 is applied to the second contact 420. The first voltage V1 is sufficiently high to develop currents through the first, second and third resistor fuses R1, R2, R3 exceeding a predetermined current threshold thereof. The currents through the first, second and third resistor fuses R1, R2, R3 cause the voids 440 to develop proximate the positive polarity. Since the high value resistors 430 are coupled to the first, second and third resistor fuses R1, R2, R3, but at a sufficient distance from the second contact 420, the high value resistors 430 may remain a part of the adjustable resistor 400 after the application of the first voltage V1.

A second voltage V2 is then is applied across the adjustable resistor such that a positive polarity of the second voltage V2 is applied to the first contact 410 while a negative polarity of the second voltage V2 is applied to the second contact 420. The second voltage V2 is sufficiently high to develop currents through the fourth, fifth, sixth and seventh resistor fuses R4, R5, R6, R7 exceeding a predetermined current threshold thereof. The currents through the fourth, fifth, sixth and seventh resistor fuses R4, R5, R6, R7 cause the voids 440 to develop proximate the positive polarity. Since the high value resistors 430 are coupled to the fourth, fifth, sixth and seventh resistor fuses R4, R5, R6, R7, but at a sufficient distance from the first contact 410, the high value resistors 430 are effectively removed from the adjustable resistor 400 after the application of the second voltage V2.

The present scheme thus allows the adjustable resistor 400 to have a resistance in the mega-ohm range while advantageously maintaining the trimming voltage within the operating voltage of the device.

Figure 5:
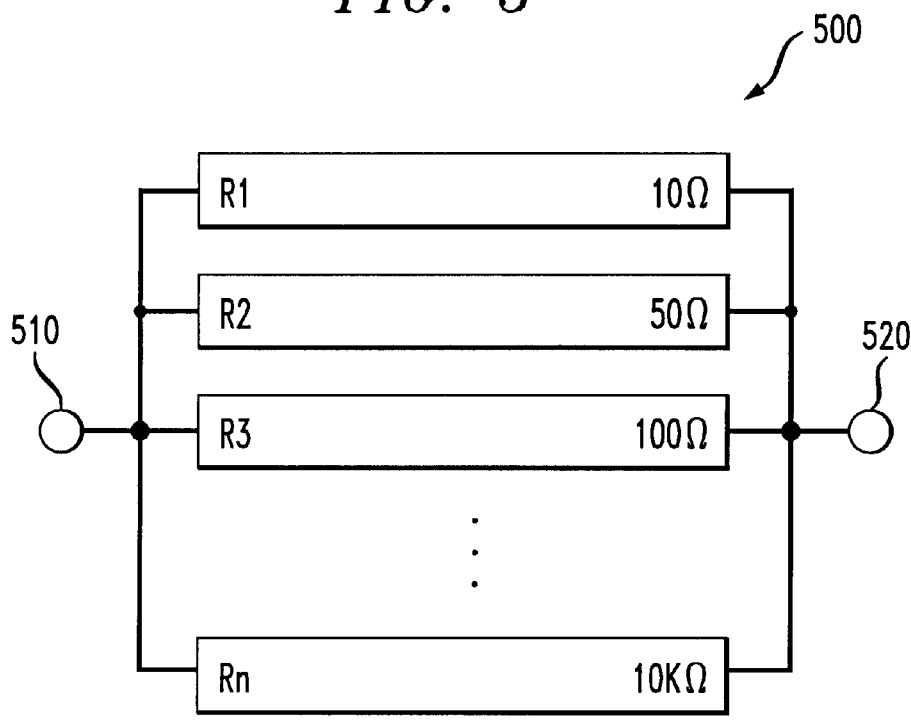
FIG. 5 illustrates a block diagram of an embodiment of a multi-state memory cell constructed in accordance with the principles of the present invention.

Turning now to FIG. 5, illustrated is a block diagram of an embodiment of a non-volatile multi-state memory cell 500 constructed in accordance with the principles of the present invention. The memory cell 500 includes a number of resistor fuses R1, R2, R3, . . . , Rn coupled in parallel and across first and second contacts 510, 520. The resistor fuses R1, R2, R3, . . . , Rn may be formed to have different physical dimensions and, therefore, different resistances. A total resistance of the memory cell 500 is a function of the resistances of the resistor fuses R1, R2, R3, Rn.

While conventional memory cells are capable of attaining one of two states (e.g., closed=R=0; opened=∞=1), the memory cell 500 of the present invention is capable of attaining n+1 discrete states, wherein n represents the number of resistor fuses R1, R2, R3, . . . , Rn forming the memory cell 500. The memory cell 500 may be programmed as follows. A voltage is applied across the memory cell 500. Currents are developed in each of the resistor fuses R1, R2, R3, . . . , Rn forming the memory cell 500. The resistor fuses R1, R2, R3, . . . , Rn form a current divider, with the resistor fuse having the least resistance drawing the most current. Depending on the voltage, the current through the resistor fuse having the least resistance may be sufficient to exceed a current threshold of the resistor fuse. The particular resistor fuse opens, thereby changing a total resistance of the memory cell 500.

Any number of the resistor fuses R1, R2, R3, . . . , Rn may be sequentially opened (starting with the lowest resistance resistor fuse) during the programming process as a function of the voltage. The memory cell 500 may therefore attain one of the n+1 discrete states as a function the resistances of the resistor fuses R1, R2, R3, . . ., Rn (i.e., a particular resistance represents one of the n+1 discrete states). Once the memory cell 500 has been programmed, the memory cell 500 is able to store the state indefinitely. In the illustrated embodiment, once any of the resistor fuses R1, R2, R3, . . . , Rn have been opened, they cannot be closed again. The memory cell 500 is thus one-time programmable.

Figure 6:
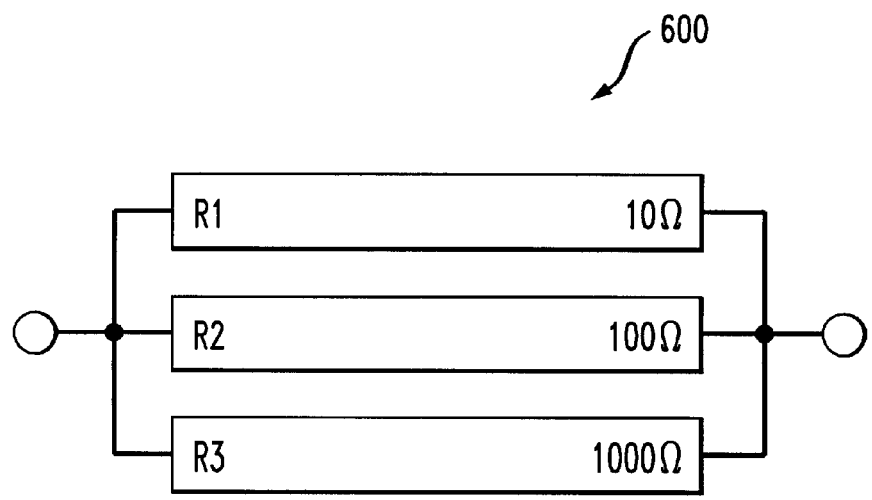
FIG. 6 illustrates a block diagram of an embodiment of a quad-state memory cell constructed in accordance with the principles of the present invention.

Turning now to FIG. 6, illustrated is a block diagram of an embodiment of a quad-state memory cell 600 constructed in accordance with the principles of the present invention. The quad-state memory cell 600 is analogous to the multi-state memory cell 500 illustrated and described with respect to FIG. 5. The quad-state memory cell 600 includes first, second and third resistor fuses R1, R2 and R3 and thus is capable of storing four discrete states.

Figure 7:
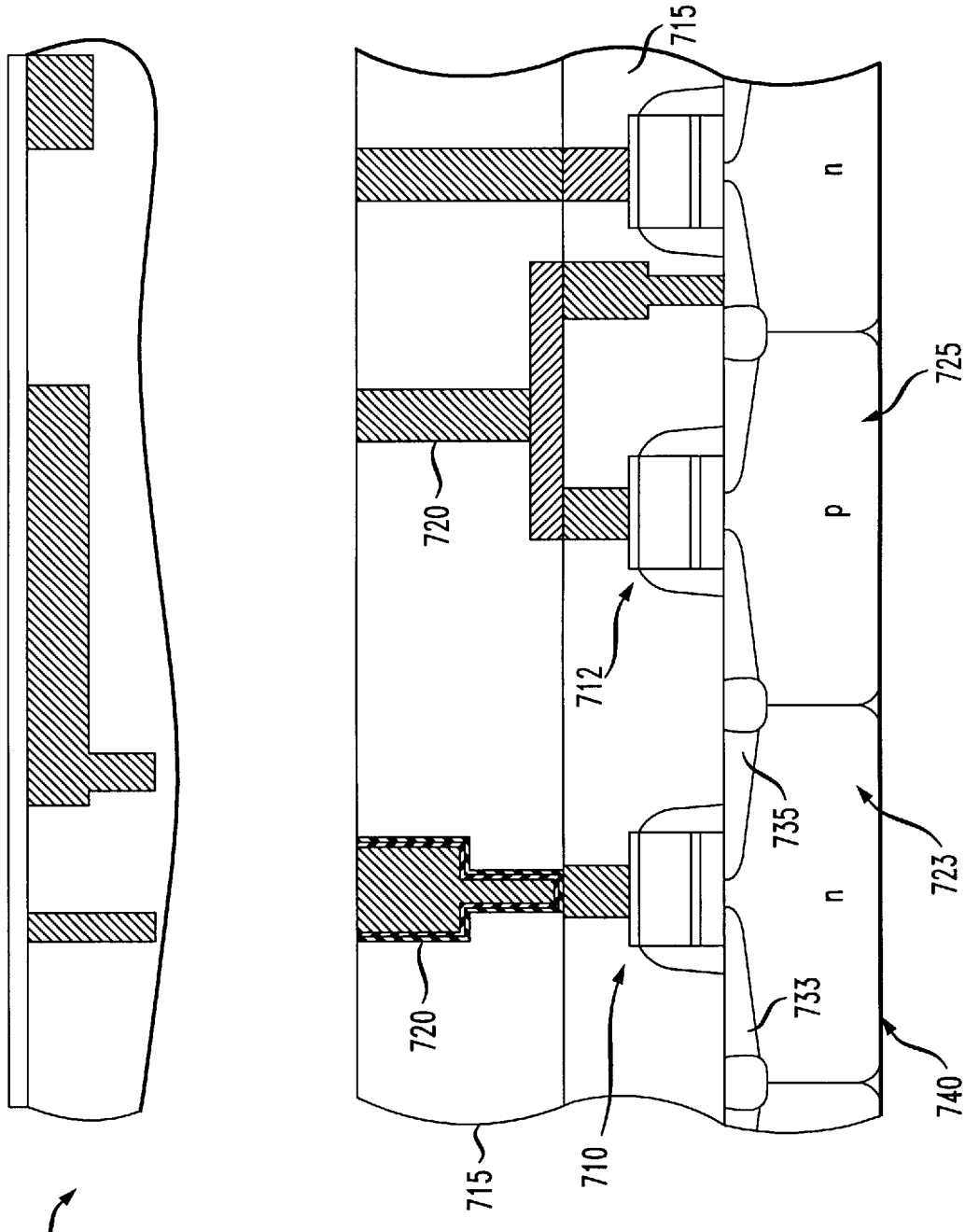
FIG. 7 illustrates a sectional view of a conventional integrated circuit that may advantageously employ the resistor fuse of the present invention.

Turning briefly to FIG. 7, illustrated is a sectional view of a conventional integrated circuit 700 that may advantageously employ the resistor fuse of the present invention. The integrated circuit 700 may be a CMOS device, a BiCMOS device, a Bipolar device or any other type of similar device. Also shown in FIG. 7, are exemplary components of the conventional integrated circuit 700, including: a low voltage transistor 610, a high voltage transistor 612, and dielectric layers 715, in which interconnect structures 720 may be formed. The interconnect structures 720 connect the transistors 710, 712 to other areas of the integrated circuit 700. Also illustrated are conventionally formed tubs, 723, 725, source regions 733 and drain regions 735, all located over a semiconductor substrate 740.

Although the present invention has been described in detail, those skilled in the art should understand that they can make various changes, substitutions and alterations herein without departing from the spirit and scope of the invention in its broadest form.

What is claimed is:

1. For use in a semiconductor device having an operating voltage, a resistor fuse, comprising:
   a silicon layer located over a semiconductor wafer; and
   a metal silicide layer located over said silicon layer, said resistor fuse having a predetermined current threshold and configured to open if a current through said resistor fuse at said operating voltage exceeds said current threshold.

2. The resistor fuse as recited in claim 1 wherein said silicon layer is a poly-silicon layer.

3. The resistor fuse as recited in claim 1 wherein said metal silicide layer is a tungsten silicide layer.

4. The resistor fuse as recited in claim 1 wherein said resistor fuse has a resistance that is a function of physical dimensions of said resistor fuse.

5. The resistor fuse as recited in claim 1 wherein said silicon layer has a resistance that is different from a resistance of said metal silicide layer.

6. The resistor fuse as recited in claim 5 wherein said resistance of said silicon layer is higher than said resistance of said metal silicide layer.

7. The resistor fuse as recited in claim 1 wherein said resistor fuse has a void when open.

8. The resistor fuse as recited in claim 7 wherein a voltage applied across said resistor fuse has a positive polarity and a negative polarity, said void located proximate said positive polarity.

9. The resistor fuse as recited in claim 1 wherein said resistor fuse forms a portion of an adjustable resistor.

10. The resistor fuse as recited in claim 9 wherein said adjustable resistor further includes a second resistor fuse coupled in parallel to said resistor fuse, said resistor fuse having a resistance different from a resistance of said second resistor fuse.

11. The resistor fuse as recited in claim 10 wherein said resistor fuse and said second resistor fuse have substantially equal widths, said second resistor fuse having a length greater than a length of said resistor fuse.

12. The resistor fuse as recited in claim 10 wherein said adjustable resistor further includes a third resistor fuse coupled in parallel to said resistor fuse and said second resistor fuse, said third resistor fuse having a resistance different from said resistances of said resistor fuse and said second resistor fuse.

13. The resistor fuse as recited in claim 12 wherein a total resistance of said adjustable resistor is a function of said resistances of said resistor fuse and said second and third resistor fuses.

14. The resistor fuse as recited in claim 1 wherein said resistor fuse forms a portion of a non-volatile multi-state memory cell.

15. The resistor fuse as recited in claim 14 wherein said memory cell is capable of attaining one of four discrete states.

16. The resistor fuse as recited in claim 14 wherein said memory cell comprises n resistor fuses, said memory cell capable of attaining one of n+1 discrete states.

17. The resistor fuse as recited in claim 14 wherein said memory cell is one-time programmable.

18. The resistor fuse as recited in claim 14 wherein said memory cell further includes second and third resistor fuses coupled in parallel to said resistor fuse, said resistor fuse having a resistance different from resistances of said second and third resistor fuses.

19. The resistor fuse as recited in claim 18 wherein said resistor fuse and said second and third resistor fuses have substantially equal widths, but different lengths.

20. A method of operating a resistor fuse in a semiconductor device having an operating voltage, comprising:
   applying a voltage within said operating voltage across said resistor fuse;
   developing a current through said resistor fuse; and
   opening said resistor fuse as a function of said voltage.

21. The method as recited in claim 20 wherein said resistor fuse comprises:
   a poly-silicon layer formed over a semiconductor wafer; and
   a tungsten silicide layer formed over said poly-silicon layer.

22. The method as recited in claim 21 wherein said poly-silicon layer has a resistance that is different from a resistance of said tungsten silicide layer.

23. The method as recited in claim 20 wherein said opening comprises developing a void in said resistor fuse.

24. The method as recited in claim 23 wherein a voltage applied across said resistor fuse has a positive polarity and a negative polarity, said void located proximate said positive polarity.

25. A method of trimming an adjustable resistor including a first resistor fuse having a first resistance and coupled in parallel to a second resistor fuse having a second resistance different from said first resistance, comprising:
   applying a voltage across said adjustable resistor;
   developing first and second currents through said first and second resistor fuses, respectively; and
   opening at least one of said first and second resistor fuses as a function of said voltage, thereby trimming a total resistance of said adjustable resistor.

26. The method as recited in claim 25 wherein said first and second resistor fuses have substantially equal widths, said second resistor fuse having a length greater than a length of said first resistor fuse.

27. The method as recited in claim 25 wherein each of said first and second resistor fuses, comprises:
   a silicon layer located over a semiconductor wafer; and
   a metal silicide layer located over said silicon layer.

28. The method as recited in claim 27 wherein said silicon layer is a poly-silicon layer and said metal silicide layer is a tungsten silicide layer.

29. The method as recited in claim 25 wherein said adjustable resistor further comprises a third resistor fuse coupled in parallel to said first and second resistor fuses and having a third resistance different from said first and second resistances, said method, further comprising:

developing a third current through said third resistor fuse; and opening at least one of said first, second and third resistor fuses as a function of said voltage.

30. The method as recited in claim 29 wherein said total resistance of said adjustable resistor is further a function of said third resistance.

31. A method of programming a non-volatile multi-state memory cell including a first resistor fuse, having a first resistance, coupled in parallel to a second resistor fuse, having a second resistance different from said first resistance, comprising:

applying a voltage across said memory cell;

developing first and second currents through said first and second resistor fuses, respectively; and selectively opening any number of said first and second resistor fuses as a function of said voltage, said memory cell thereby attaining a state as a function of said first and second resistances.

32. The method as recited in claim 31 wherein said memory cell comprises n resistor fuses, said memory cell capable of attaining one of n+1 discrete states.

33. The method as recited in claim 31 wherein said first and second resistor fuses have substantially equal widths, but different lengths.

34. The method as recited in claim 31 wherein said memory cell is one-time programmable.

35. The method as recited in claim 31 wherein said nonvolatile multi-state memory cell further includes a third resistor fuse, having a third resistance, coupled in parallel to said first and second resistor fuses, said method further comprising:

developing a third current through said third resistor fuse; and selectively opening any number of said first, second and third resistor fuses as a function of said voltage, said memory cell thereby attaining a state as a function of said first, second and third resistances.

36. The method as recited in claim 35 wherein said memory cell is capable of attaining one of four discrete states.

37. The method as recited in claim 31 wherein each of said first and second resistor fuses, comprises:

a silicon layer located over a semiconductor wafer; and a metal silicide layer located over said silicon layer.

38. The method as recited in claim 37 wherein said silicon layer is a poly-silicon layer and said metal silicide layer is a tungsten silicide layer.

39. For use in a semiconductor device having an operating voltage, a resistor fuse, comprising:

a first conductive layer located over a semiconductor wafer and having a first resistance; and a second conductive layer located over said first conductive layer and having a second resistance different from said first resistance, said resistor fuse having a predetermined current threshold and configured to open if a current through said resistor fuse at said operating voltage exceeds said current threshold.

* * * * *